(12) United States Patent
Lee

(10) Patent No.: US 6,531,383 B1
(45) Date of Patent: Mar. 11, 2003

(54) METHOD FOR MANUFACTURING A COMPOUND SEMICONDUCTOR DEVICE

(75) Inventor: Ching-ting Lee, Tao Yuan (TW)

(73) Assignee: Opto Tech Corporation (TW)

( * ) Notice: Subject to any disclaimer, the term of this patent is extended or adjusted under 35 U.S.C. 154(b) by 0 days.

(21) Appl. No.: 09/671,946

(22) Filed: Sep. 27, 2000

(30) Foreign Application Priority Data

Jul. 28, 2000 (TW) .......................................... 89115205 A (51) Int. Cl.[7] .............................................. H01L 21/28
(52) U.S. Cl. ......................................... 438/604; 438/22
(58) Field of Search ...................... 438/22–30, 752–757, 438/793–799, 47, 604; 257/96, 102, 192, 749

(56) References Cited

U.S. PATENT DOCUMENTS

| | | | |
|---|---|---|---|
| 5,652,434 A | * | 7/1997 | Nakamura et al. .......... 257/749 |
| 5,767,581 A | * | 6/1998 | Nakamura et al. .......... 257/749 |
| 5,777,350 A | * | 7/1998 | Nakamura et al. ............ 257/96 |
| 5,877,558 A | * | 3/1999 | Nakamura et al. .......... 257/749 |
| 6,093,965 A | * | 7/2000 | Nakamura et al. .......... 257/749 |
| 6,198,116 B1 | * | 3/2001 | Cerny et al. ................ 257/192 |
| 6,242,761 B1 | * | 6/2001 | Fujimoto et al. ........... 257/102 |

* cited by examiner

Primary Examiner—David Nelms
Assistant Examiner—Long Tran
(74) Attorney, Agent, or Firm—Martine & Penilla, LLP (57) ABSTRACT

The invention provides a method for manufacturing a gallium nitride-based III-V group compound semiconductor device, which comprises the following steps: forming a semiconductor stacked structure over a substrate, wherein the semiconductor stacked structure comprises an n-type semiconductor layer, an active layer, and a p-type semiconductor layer; etching the semiconductor stacked structure to expose a part of the n-type semiconductor layer; forming a first electrode on the n-type semiconductor layer, wherein the first electrode comprises an ohmic contact layer, a barrier layer, and a pad layer; performing an annealing process to lower the contact resistance between the first electrode and the n-type semiconductor layer and activate the p-type semiconductor layer at the same time; and forming a second electrode on the p-type semiconductor layer.

5 Claims, 7 Drawing Sheets

METHOD FOR MANUFACTURING A COMPOUND SEMICONDUCTOR DEVICE

BACKGROUND OF THE INVENTION

1. Field of the Invention

The invention relates to a method for manufacturing a gallium nitride-based III-V group compound semiconductor device.

2. Description of the Related Art

Since epitaxial layers of III-V group nitride such as gallium nitride (GaN), aluminum gallium nitride (AlGaN), indium gallium nitride (InGaN), and aluminum indium gallium nitride (AlInGaN) were first grown successfully, they have become promising materials for use in high temperature/high power electronic devices and opotoelectronic devices, due to their high direct band gap, high saturation drift velocity, high breakdown field, and chemical inertness. Recent improvements in crystal quality of epitaxial layers with increased dopant concentrations have led to high quality laser diodes, light-emitting diodes, photodetectors, and microwave field effect transistors having been developed based on these epitaxial III-V group nitride structures.

In general, the performance of III-V group nitride device has been limited by contact resistance. Therefore, a key technology in achieving higher performance for III-V group nitride devices is the realization of more reliable metal contacts. Although a wide variety of metals used as contacts with GaN have been reported, the metallic titanium/aluminum (Ti/Al) bilayer has been most widely used as a conventional ohmic contact for n-type GaN. However, such a Ti/Al bilayer is prone to oxidation, which in turn leads to high ohmic resistance during the fabrication process and during operation.

To avoid the oxidation propensity at elevated temperatures, a low resistivity gold (Au) layer should be effective for passivating the Ti/Al bilayer. However, gold would interdiffuse and penetrate into the GaN semiconductor layer, causing deterioration in thermal stability, and ohmic contact property of the semiconductor device.

Figure 1:
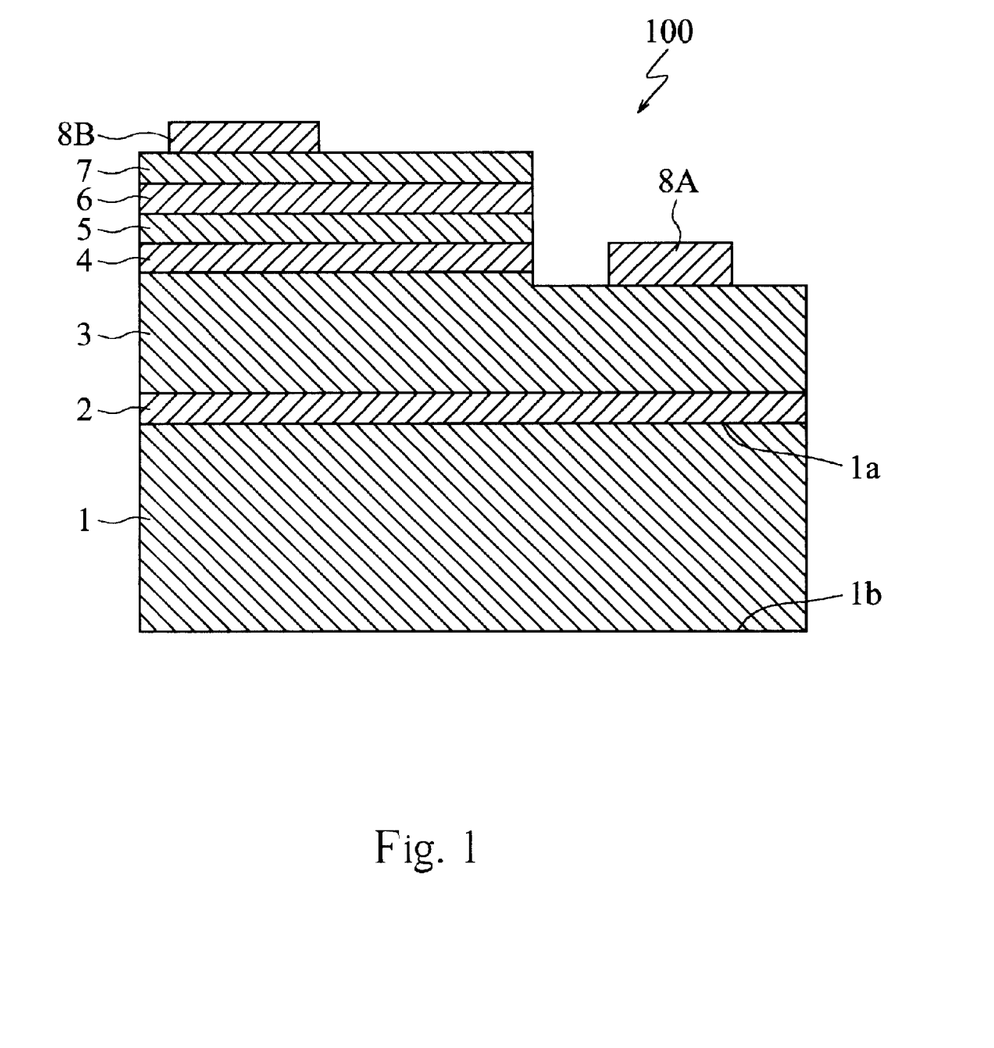
FIG. 1 is a cross-sectional view showing a GaN-based III-V group compound semiconductor light-emitting device in accordance with the invention.

FIG. 1 is a cross-sectional view showing a typical structure of a GaN-based III-V group compound semiconductor light-emitting device (LED) 100.

As shown in FIG. 1, an LED 100 includes an insulated substrate 1 made of such as sapphire. The substrate 1 has a first major surface 1a and a second major surface 1b. A GaN buffer layer 2 is formed on the first major surface 1a of the substrate 1. An n-type GaN-based III-V group compound semiconductor layer 3 is formed on the buffer layer 2. The n-type semiconductor layer 3 is doped by n-type dopants such as germanium (Ge), selenium (Se), sulfur (S), or tellurium (Te). In addition, the n-type semiconductor layer 3 can be doped by silicon (Si).

An n-type AlGaN layer 4 is formed on the n-type semiconductor layer 3. An active layer 5 is formed on the n-type AlGaN layer 4, and the active layer 5 has a multiple quantum well (MQW) structure, a single quantum well (SQW) structure, or a double-heterostructure (DH) made of such as InGaN/GaN. A p-type AlGaN layer 6 is formed on the active layer 5. The p-type AlGaN layer 6 is doped with p-type dopants such as beryllium (Be), strontium (Sr), barium (Ba), zinc (Zn), or magnesium.

A p-type GaN-based III-V group compound semiconductor layer 7 is formed on the p-type AlGaN layer 6. The p-type semiconductor layer 7 is doped with p-type dopants such as beryllium, strontium, barium, zinc, or magnesium.

As shown in FIG. 1, the LED 100 includes an electrode 8A formed on the n-type semiconductor layer 3 and an electrode 8B formed on the p-type semiconductor layer 7. Conventionally, the electrode 8A includes a metal such as titanium, aluminum, or gold as mentioned above. The electrode 8B is a kind of ohmic electrode, it includes a metal such as nickel (Ni), chromium (Cr), gold or platinum.

Figure 2:
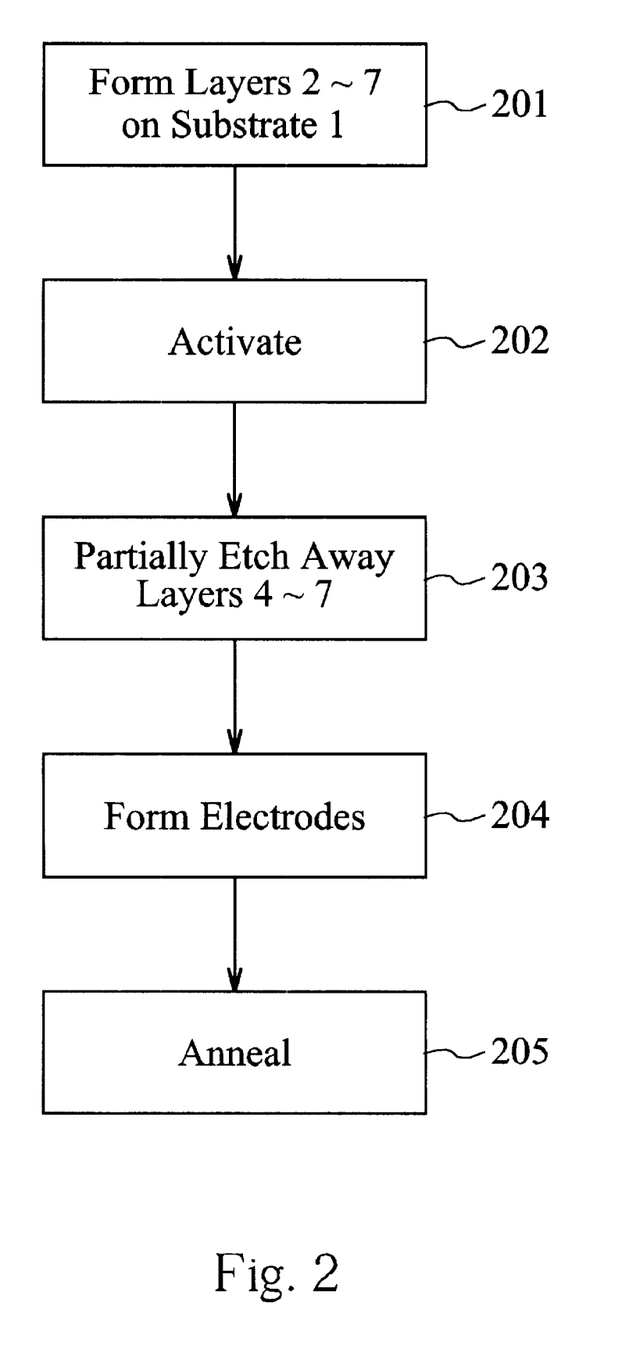
FIG. 2 is a flow chart showing fabrication steps for a conventional light-emitting device 100.

Referring to FIG. 2, the flow chart shows conventional steps for manufacturing a light-emitting device 100.

First, as shown in step 201, a buffer layer 2, an n-type semiconductor layer 3, an n-type AlGaN layer 4, an active layer 5, a p-type AlGaN layer 6, and a p-type semiconductor layer 7 are formed on a substrate 1 in this order.

Next, as shown in step 202, a thermal process is performed to activate the p-type AlGaN layer 6 and the p-type semiconductor layer 7. Since doped magnesium atoms in the p-type AlGaN layer 6 and p-type semiconductor layer 7 form Mg—H bonds, holes are not provided. The thermal process is to break the Mg—H bonds and activate the p-type AlGaN layer 6 and p-type semiconductor layer. 7. The thermal process is performed at a temperature ranging from 650 to 780° C. for 15 to 60 minutes.

Then, as shown in step 203, the p-type semiconductor layer 7, p-type AlGaN layer 6, active layer 5, and n-type AlGaN layer 4 are partially etched away to expose a surface of the n-type semiconductor layer 3. Here, a part of the n-type semiconductor layer 3 is also etched away.

Next, as shown in step 204, electrodes 8A and 8B are formed, wherein the electrode 8A is formed on the n-type semiconductor layer 3, and the electrode 8B is formed on the p-type semiconductor layer 7. The electrodes 8A and 8B can be formed by known deposition methods such as evaporation or sputtering.

Next, as shown in step 205, an annealing process is performed. The object of this step is to lower the ohmic contact resistance of the electrodes 8A and 8B. The annealing process is generally performed at a temperature ranging from 300 to 600° C.

It should be noted that besides forming the electrodes 8A and 8B at the same time as mentioned in step 204, it can also be first forming the electrode 8A, and after the annealing process, forming the electrode 8B.

SUMMARY OF THE INVENTION

The invention provides a method for manufacturing a gallium nitride-based III-V group compound semiconductor device, includes the following steps: providing a substrate having a first and a second major surfaces; forming a semiconductor stacked structure over the first major surface of the substrate, wherein the semiconductor stacked structure includes an n-type gallium nitride-based III-V group compound semiconductor layer, an active layer, and a p-type gallium nitride-based III-V group compound semiconductor layer; etching the semiconductor stacked structure to expose a part of the n-type semiconductor layer; forming a first electrode on the n-type semiconductor layer, wherein the first electrode includes an ohmic contact layer, a barrier layer over the ohmic contact layer, and a pad layer over the barrier layer; and performing an annealing process for lowering the contact resistance between the first electrode and the n-type semiconductor layer, and activating the p-type semiconductor layer simultaneously; and forming a second electrode on the p-type semiconductor layer.

A gallium nitride-based III-V group compound semiconductor device in accordance with an embodiment of the invention includes an n-type gallium nitride-based III-V group compound semiconductor layer; and an electrode on the n-type gallium nitride-based III-V group compound semiconductor layer, and the electrode includes an ohmic contact layer, a barrier layer over the ohmic contact layer, and a pad layer over the barrier layer.

A gallium nitride-based III-V group compound semiconductor device in accordance with another embodiment of the invention includes a substrate having a first and a second major surfaces; a semiconductor stacked structure formed over the first major surface of the substrate and which includes an n-type gallium nitride-based III-V group compound semiconductor layer, an active layer, and a p-type gallium nitride-based III-V group compound semiconductor layer; a first electrode on the n-type semiconductor layer and which includes an ohmic contact layer, a barrier layer over the ohmic contact layer, and a pad layer over the barrier layer; and a second electrode on the p-type semiconductor layer.

The ohmic contact of the n-type GaN of the invention has thermal stability endurance much better than that of a conventional Ti/Al/Au multilayer. Therefore, the method for manufacturing the compound semiconductor device of the invention is simpler than the conventional method, and can thus lower the costs and increase the yield.

DESCRIPTION OF THE PREFERRED EMBODIMENT

In the invention, a term "gallium nitride-based III-V group compound semiconductor" means a nitride semiconductor of III group element including gallium such as GaN, AlGaN, InGaN, or InAlGaN.

The invention is described in detail below with references being made to relevant drawings.

Figure 3:
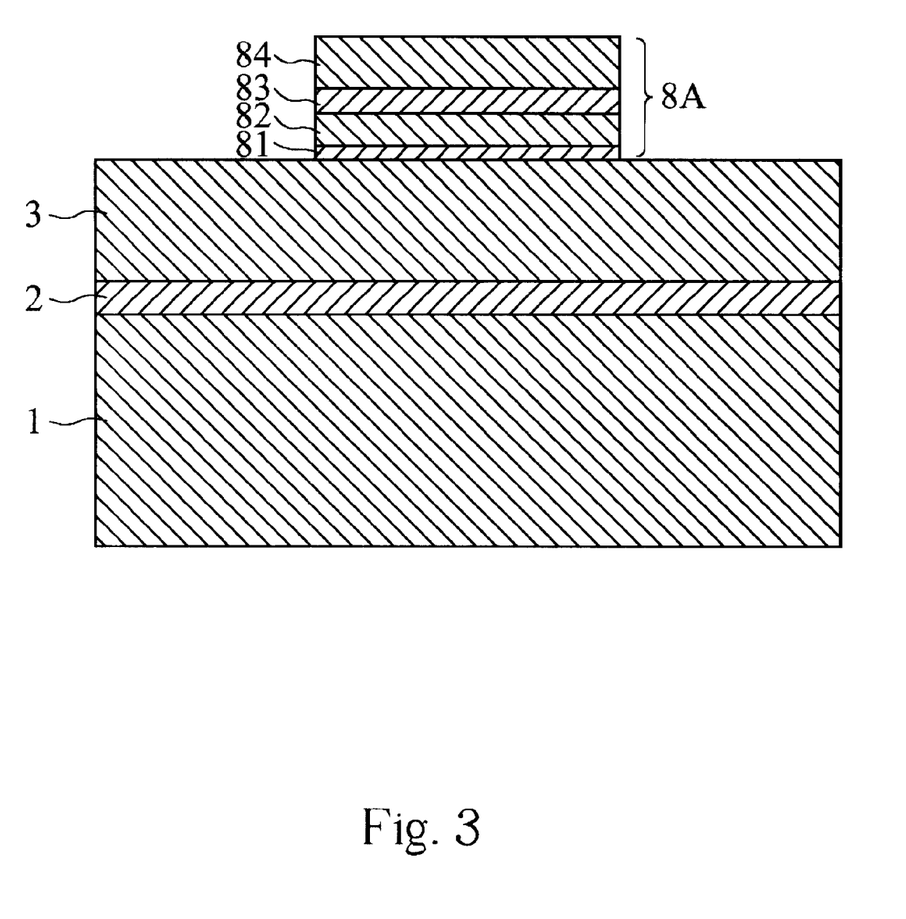
FIG. 3 is a cross-sectional view showing the structure of electrode of the invention.

The invention provides a structure of electrode 8A which includes an ohmic contact layer including such as nitride titanium, titanium, aluminum, chromium, indium, palladium, or an alloy from above-mentioned metals; a barrier layer over the ohmic contact layer including such as platinum, tungsten (W), or nickel; and a pad layer over the barrier layer including such as gold. Since the electrode 8A of the invention has a barrier layer, the gold of pad layer is prevented from interdiffusing and penetrating into the semiconductor device.

Referring to FIG. 3, which shows an example of the electrode 8A of the invention. Layers of the structure shown in FIG. 3 are labeled with same reference numerals designating corresponding layers shown in FIG. 1. As shown in FIG. 3, a GaN buffer layer 2 is formed on a substrate 1. An n-type semiconductor layer 3 is formed on the buffer layer 2. The n-type semiconductor layer 3 can be doped with silicon. An electrode 8A is formed on the n-type semiconductor layer 3. The electrode 8A includes a titanium layer 81, an aluminum layer 82 formed on the titanium layer 81, a platinum layer 83 formed on the aluminum layer 82, and a gold layer 84 formed on the platinum layer 83. The electrode 8A (Ti/Al/Pt/Au) as an example is illustrated below with its superior property as an ohmic contact for n-type GaN.

EXAMPLE 1

A 300 nm GaN buffer layer is grown on a sapphire substrate at 520° C. Next, a 2 $\mu$m n-type GaN layer is formed on the GaN buffer layer by metalorganic chemical vapor deposition (MOCVD) at 1100° C., wherein the carrier concentration and mobility are $6.7 \times 10^{17}$ cm$^{-3}$ and 367 cm$^2$/V-S, respectively.

Figure 4:
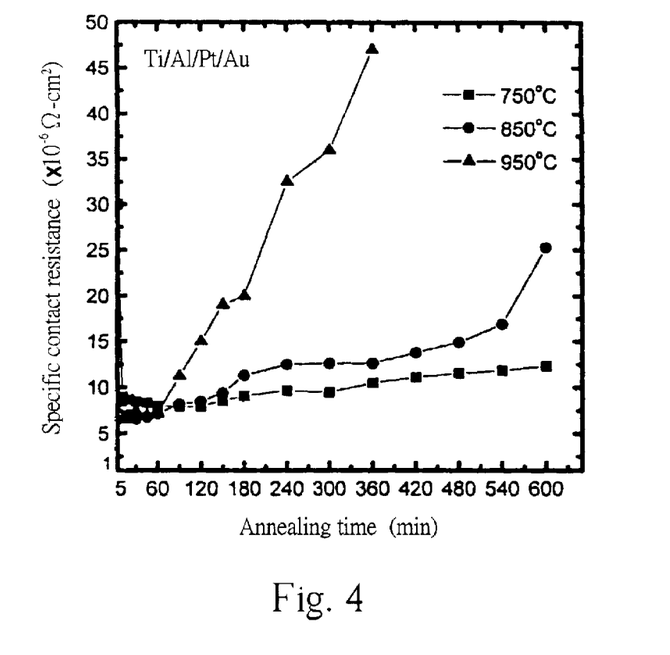
FIG. 4 is a graph showing the dependence of specific contact resistance on annealing time at various annealing temperatures for the electrode Ti/Al/Pt/Au in contact with n-type GaN.

Next, the electrode Ti/Al/Pt/Au (25/100/50/200 nm) of the invention is formed on the n-type GaN layer. Thus formed samples are annealed in nitrogen (N$_2$) atmosphere at various temperatures (750° C., 850° C., and 950° C.) and various times, and specific contact resistances ($\rho_C$) are measured. Experimental results are shown in FIG. 4.

EXAMPLE 2

A 300 nm GaN buffer layer is grown on a sapphire substrate at 520° C. Next, a 2 $\mu$m n-type GaN layer is formed on the GaN buffer layer by MOCVD at 1100° C., wherein the carrier concentration and mobility are $6.7 \times 10^{17}$ cm$^{-3}$ and 367 cm$^2$/V-S, respectively. Then, Si is implanted into the n-type GaN layer at an energy of 50 KeV and a dose of $5 \times 10^{15}$ cm$^{-2}$.

Figure 5:
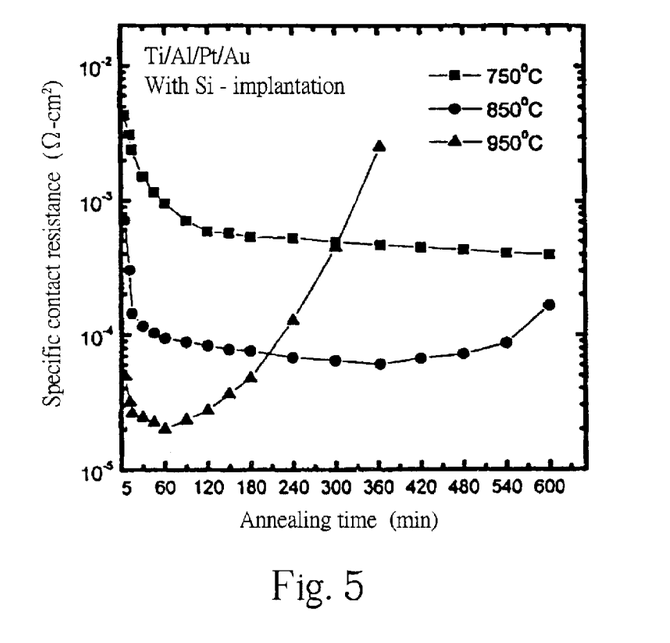
FIG. 5 is a graph showing the dependence of specific contact resistance on annealing time at various annealing temperatures for the electrode Ti/Al/Pt/Au in contact with unrecovered Si-implanted n-type GaN.

Next, the electrode Ti/Al/Pt/Au (25/100/50/200 nm) of the invention is formed on the Si-implanted n-type GaN layer. Thus formed samples are annealed under N$_2$ atmosphere at various temperatures (750° C., 850° C., and 950° C.) and various times, and specific contact resistances ($\rho_C$) are measured. Experimental results are shown in FIG. 5.

EXAMPLE 3

A 300 nm GaN buffer layer is grown on a sapphire substrate at 520° C. Next, a 2 $\mu$m n-type GaN layer is formed on the GaN buffer layer by MOCVD at 1100° C., wherein the carrier concentration and mobility are $6.7 \times 10^{17}$ cm$^{-3}$ and 367 cm$^2$/V-S, respectively. Then, Si is implanted into the n-type GaN layer at an energy of 50 KeV and a dose of $5 \times 10^{15}$ cm$^{-2}$. Next, the Si-implanted n-type GaN layer is annealed at 1050° C. under N$_2$ atmosphere for 30 minutes, to aid in the recovery of crystal and to activate implanted Si of the n-type GaN layer.

Figure 6:
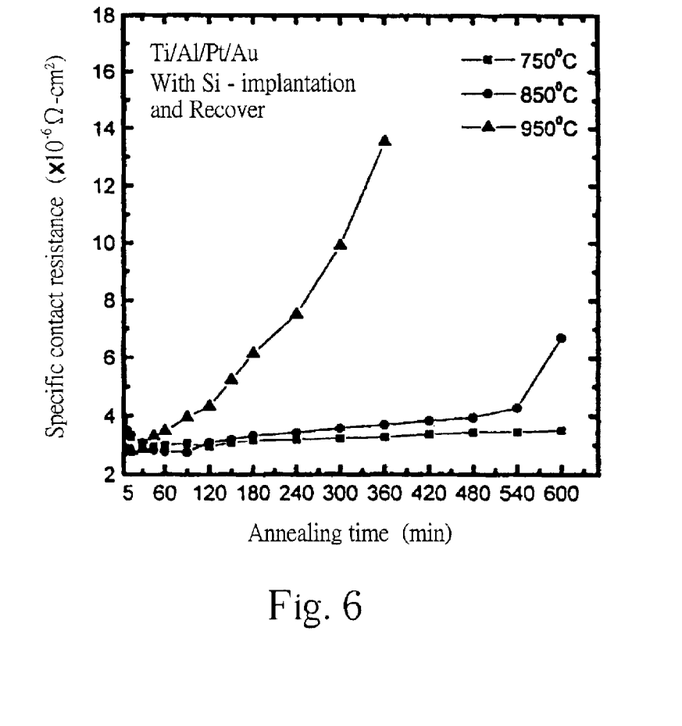
FIG. 6 is a graph showing the dependence of specific contact resistance on annealing time at various annealing temperatures for the electrode Ti/Al/Pt/Au in contact with recovered Si-implanted n-type GaN.

Then, the electrode Ti/Al/Pt/Au (25/100/50/200 nm) of the invention is formed on the Si-implanted and recovered n-type GaN layer. Thus formed samples are annealed under N$_2$ atmosphere at various temperatures (750° C., 850° C., and 950° C.) and various times, and specific contact resistances ($\rho_C$) are measured. Experimental results are shown in FIG. 6.

Comparative Example 1

A 300 nm GaN buffer layer is grown on a sapphire substrate at 520° C. Next, a 2 μm n-type GaN layer is formed on the GaN buffer layer by MOCVD at 1100° C., wherein the carrier concentration and mobility are $6.7 \times 10^{17}$ cm$^{-3}$ and 367 cm$^2$/V-S, respectively.

Figure 7:
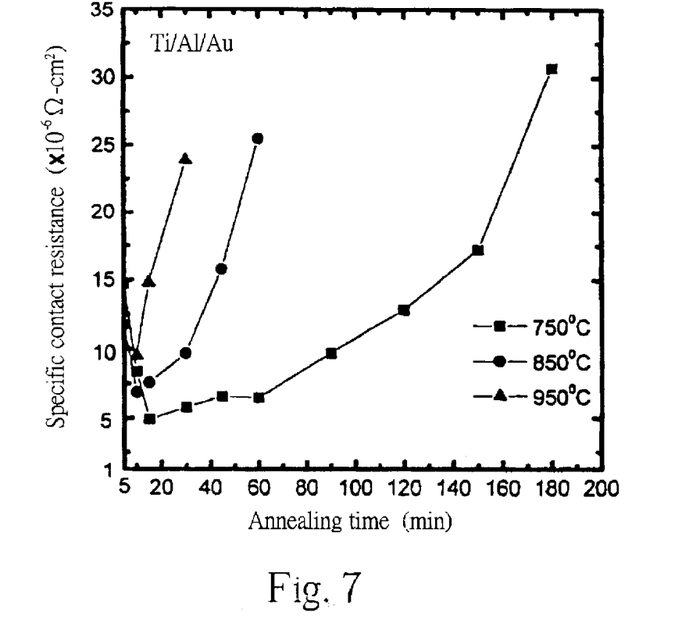
FIG. 7 is a graph showing the dependence of specific contact resistance on annealing time at various annealing temperatures for the electrode Ti/Al/Au in contact with n-type GaN.

Then, a comparative electrode Ti/Al/Au (25/100/200 nm) is formed on the n-type GaN layer. Thus formed samples are annealed under N$_2$ atmosphere at various temperatures (750° C., 850° C., and 950° C.) and various times, and specific contact resistances ($\rho_C$) are measured. Experimental results are shown in FIG. 7.

Comparative Example 2

A 300 nm GaN buffer layer is grown on a sapphire substrate at 520° C. Next, a 2 μm n-type GaN layer is formed on the GaN buffer layer by MOCVD at 1100° C., wherein the carrier concentration and mobility are $6.7 \times 10^{17}$ cm$^{-3}$ and 367 cm$^2$/V-S, respectively. Then, Si is implanted into the n-type GaN layer at an energy of 50 KeV and a dose of $5 \times 10^{15}$ cm$^{-2}$.

Figure 8:
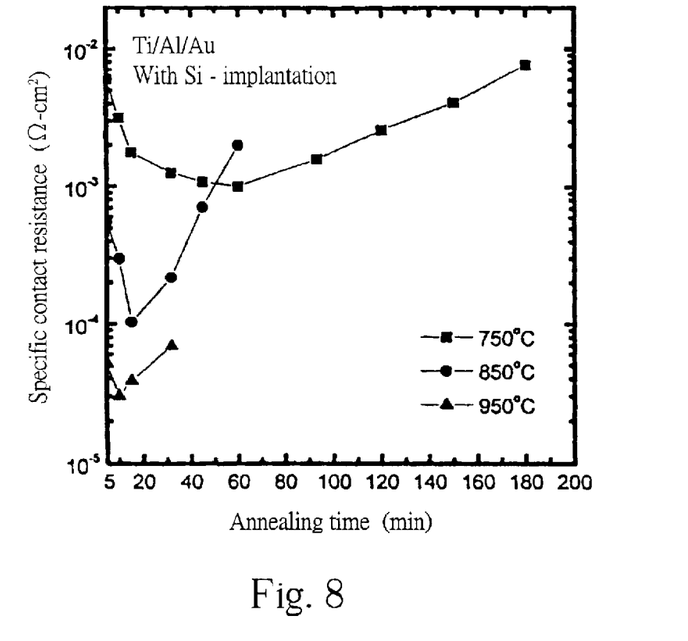
FIG. 8 is a graph showing the dependence of specific contact resistance on annealing time at various annealing temperatures for the electrode Ti/Al/Au in contact with unrecovered Si-implanted n-type GaN.

Next, a comparative electrode Ti/Al/Au (25/100/200 nm) is formed on the Si-implanted n-type GaN layer. Thus formed samples are annealed under N$_2$ atmosphere at various temperatures (750° C., 850° C., and 950° C.) and various times, and specific contact resistances ($\rho_C$) are measured. Experimental results are shown in FIG. 8.

Comparative Example 3

A 300 nm GaN buffer layer is grown on a sapphire substrate at 520° C. Next, a 2 μm n-type GaN layer is formed on the GaN buffer layer by MOCVD at 1100° C., wherein the carrier concentration and mobility are $6.7 \times 10^{17}$ cm$^{-3}$ and 367 cm$^2$/V-S, respectively. Then, Si is implanted into the n-type GaN layer at an energy of 50 KeV and a dose of $5 \times 10^{15}$ cm$^{-2}$. Next, the Si-implanted n-type GaN layer is annealed at 1050° C. under N$_2$ atmosphere for 30 minutes, to aid in the recovery of crystal and to activate implanted Si of the n-type GaN layer.

Then, a comparative electrode Ti/Al/Au (25/100/200 nm) is formed on the Si-implanted and recovered n-type GaN layer. Thus formed samples are annealed under N$_2$ atmosphere at various temperatures (750° C., 850° C., and 950° C.) and various times, and specific contact resistances ($\rho_C$) are measured. Experimental results are shown in FIG. 9.

Table 1 below shows details of each of the Examples of the invention.

TABLE 1

Figure 9:
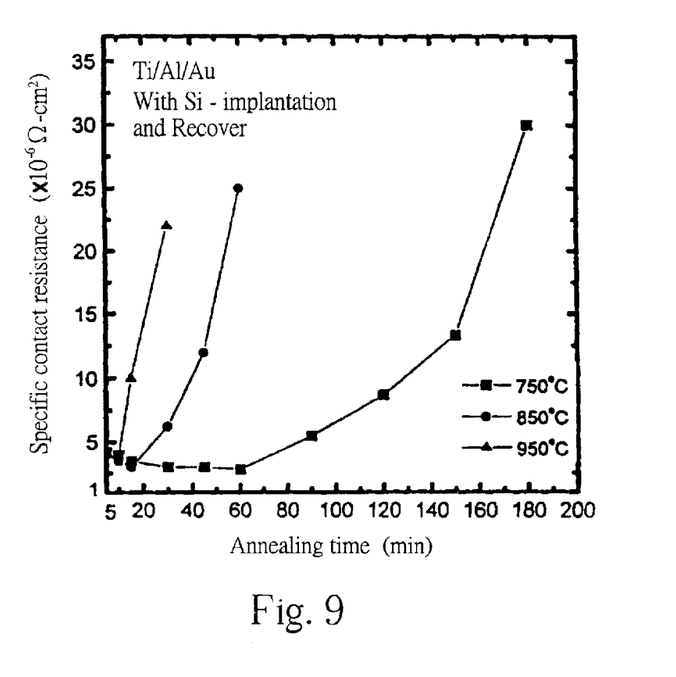
FIG. 9 is a graph showing the dependence of specific contact resistance on annealing time at various annealing temperatures for the electrode Ti/Al/Au in contact with recovered Si-implanted n-type GaN.

| | Example 1 | Example 2 | Example 3 | Comparative Example 1 | Comparative Example 2 | Comparative Example 3 |
|---|---|---|---|---|---|---|
| Si-implanted | | ✓ | ✓ | | ✓ | ✓ |
| Recovery | | | ✓ | | | ✓ |
| Ti/Al/Au | | | | ✓ | ✓ | ✓ |
| Ti/Al/Pt/Au | ✓ | ✓ | ✓ | | | |
| Results shown in | FIG. 4 | FIG. 5 | FIG. 6 | FIG. 7 | FIG. 8 | FIG. 9 |

Example 1 is for the electrode Ti/Al/Pt/Au of the invention in contact with n-type GaN, and FIG. 4 is a graph showing the dependence of the specific contact resistance $\rho_C$ for Ti/Al/Pt/Au in contact with GaN on the annealing time at various annealing temperatures. In FIG. 4, the lowest specific contact resistance $\rho_C$ is about $8 \times 10^{-6}$ Ω-cm$^2$ for 750° C., $7 \times 10^{-6}$ Ω-cm$^2$ for 850° C., and $7 \times 10^{-6}$ Ω-cm$^2$ for 950° C. Comparative Example 1 is for the electrode Ti/Al/Au in contact with n-type GaN, and FIG. 7 is a graph showing the dependence of the specific contact resistance $\rho_C$ for Ti/Al/Au in contact with GaN on annealing time at various annealing temperatures. When comparing FIG. 4 and FIG. 7 we found that the Ti/Al/Pt/Au and Ti/Al/Au multilayer contacts on n-type GaN exhibit similar values of minimum specific contact resistance. However, the Ti/Al/Pt/Au multilayer has a much better thermal stability endurance than that of the Ti/Al/Au multilayer.

Example 2 is for the electrode Ti/Al/Pt/Au in contact with unrecovered Si-implanted n-type GaN, and FIG. 5 is a graph showing the dependence of the specific contact resistance $\rho_C$ for Ti/Al/Pt/Au in contact with Si-implanted GaN on annealing time at various annealing temperatures. Comparative Example 2 is for the electrode Ti/Al/Au in contact with unrecovered Si-implanted n-type GaN, and FIG. 8 is a graph showing the dependence of the specific contact resistance $\rho_C$ for Ti/Al/Au in contact with Si-implanted GaN on annealing time at various annealing temperatures. As shown in FIGS. 5 and 8, at the annealing temperature of 750° C., the two kinds of electrode have a similar dependence of specific contact resistance on annealing time for 60 minutes. It is to be noted that in Comparative Example 2, a minimum specific contact resistance is obtained at 60 minutes for 750° C., but after 60 minutes the specific contact resistance greatly increases as the time increases. However, in Example 2, as shown in FIG. 5, when annealing at 750° C., the specific contact resistance gradually decreases as the increase of annealing time.

In FIG. 5, the minimum specific contact resistance $\rho_C$ is $7 \times 10^{-4}$ Ω-cm$^2$ for 750° C. (beyond 600 minutes), $7 \times 10^{-5}$ Ω-cm$^2$ for 850° C. (at 540 minutes), and $2 \times 10^{-5}$ Ω-cm$^2$ for 950° C. (at 60 minutes). In accordance with the experimental results shown in FIG. 5 and FIG. 8, the electrode Ti/Al/Pt/Au of the invention has a much better thermal stability than that of the comparative electrode Ti/Al/Au. The thermal stability endurance for the ohmic performance of the Ti/Al/Pt/Au multilayer annealed at 850° C. and 950° C. is about 540 minutes and 60 minutes, respectively, but longer than 600 minutes for annealing at 750° C.

Example 3 is for the electrode Ti/Al/Pt/Au in contact with Si-implanted and recovered n-type GaN, and FIG. 6 is a graph showing the dependence of the specific contact resistance $\rho_C$ for the Ti/Al/Pt/Au in contact with recovered Si-implanted GaN on annealing time at various annealing temperatures. In FIG. 6, the minimum specific contact resistance $\rho_C$ is about $3\times10^{-6}$ $\Omega$-cm$^2$ for annealing temperatures of 750° C., 850° C., and 950° C. Comparative Example 3 is for the electrode Ti/Al/Au in contact with Si-implanted and recovered n-type GaN, and FIG. 9 is a graph showing the dependence of specific contact resistance $\rho_C$ for the Ti/Al/Au in contact with recovered Si-implanted GaN on annealing time at various annealing temperatures. When comparing the experimental results shown in FIGS. 6 and 9, the comparative electrode Ti/Al/Au and the electrode Ti/Al/Pt/Au of the invention have similar minimum specific contact resistance at the same annealing temperature. However, the electrode Ti/Al/Pt/Au of the invention has a much better thermal stability endurance than that of the Ti/Al/Au multilayer.

As mentioned above, since the doped magnesium atoms in the p-type AlGaN layer 6 and the p-type semiconductor layer 7 would form Mg—H bonds and holes are not provided, conventionally a thermal process is performed after forming the p-type semiconductor layer 7 so as to break the Mg—H bonds and activate the p-type AlGaN layer 6 and the p-type semiconductor layer 7. The thermal process is performed generally at a temperature ranging from 700 to 750° C. for 15 to 60 minutes. However, since the Ti/Al/Pt/Au multilayer of the invention has a high thermal stability endurance, it is beyond question that the activating effect of the p-type AlGaN layer 6 and the p-type semiconductor layer 7 can be achieved at the same time when the ohmic contact is formed in the annealing process. Therefore, the fabrication process for the light-emitting device of the invention can omit the conventional activation step, and achieve the same effect in a subsequent fabrication step. The fabrication process of the light-emitting device in accordance with the invention is described below with reference being made to FIG. 10.

Figure 10:
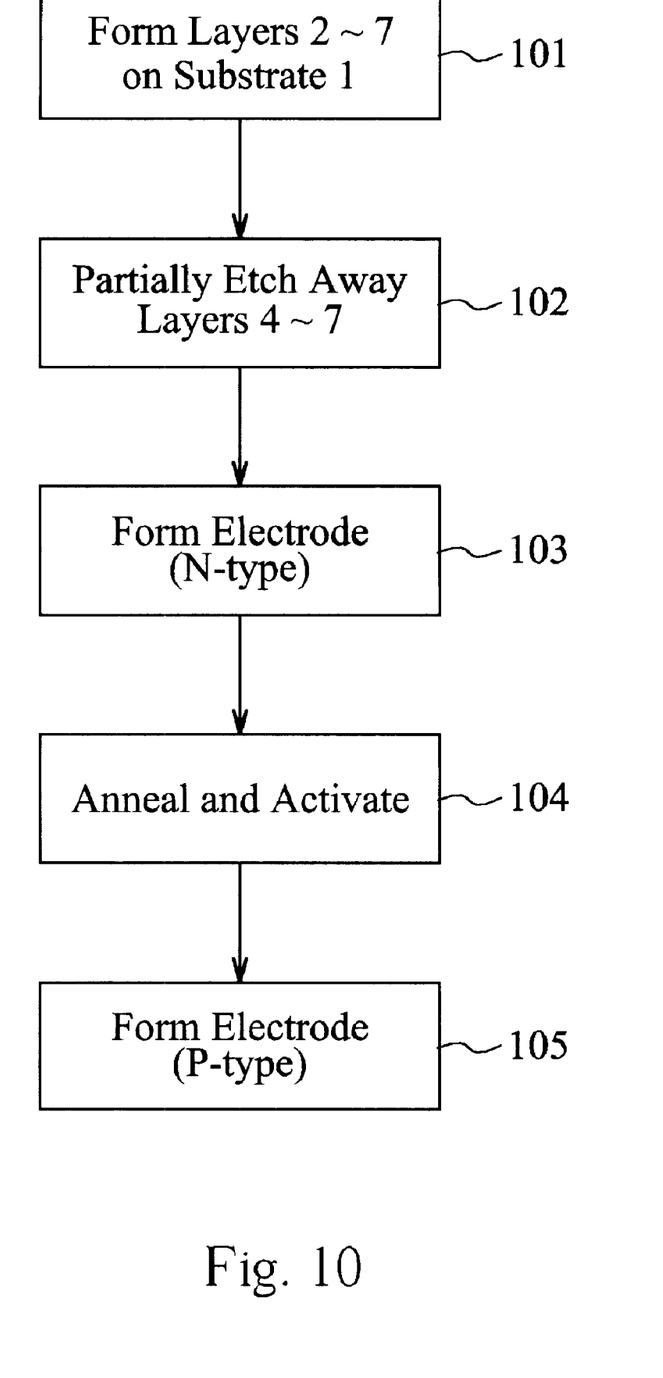
FIG. 10 is a flow chart showing fabrication steps for a light-emitting device of the invention.

First, as shown in step 101, a buffer layer 2, an n-type semiconductor layer 3, an n-type AlGaN layer 4, an active layer 5, a p-type AlGaN layer 6, and a p-type semiconductor layer 7 are formed on the substrate 1 in this order.

Next, as shown in step 102, the p-type semiconductor layer 7, p-type AlGaN layer 6, active layer 5, and n-type AlGaN layer 4 are partially etched away to expose a surface of the n-type semiconductor layer 3. Here, a part of the n-type semiconductor layer 3 is also etched away.

Next, as shown in step 103, an electrode 8A is formed on the n-type semiconductor layer 3. The electrodes 8A can be formed by known deposition methods such as evaporation or sputtering. Besides, as described in above-mentioned examples, before forming the electrode 8A on the n-type semiconductor layer 3, a step of implanting silicon atoms into the n-type semiconductor layer and a recovery of the n-type semiconductor layer can be performed.

Then, as shown in step 104, an annealing process is performed. The object of this step is to lower the ohmic contact resistance of the electrode 8A. The annealing process is performed at a temperature ranging from 400 to 950° C. Under this annealing condition, activating effect of the p-type semiconductor layer 7 can be achieved at the same time.

Next, as shown in step 105, the electrode 8B is formed on the p-type semiconductor layer 7 by such as evaporation or sputtering. After forming the electrode 8B, an annealing at a low-temperature of below 700° C. can be performed to lower the ohmic contact resistance of the electrode 8B.

As above, since the annealing and activating effect can be achieved at the same time in step 104, the method for manufacturing a compound semiconductor device provided by the invention is simpler than conventional fabrication processes, which can lower the costs and increase the yield.

While the present invention has been particularly described, in conjunction with specific examples, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for manufacturing a gallium nitride-based III-V group compound semiconductor device, comprising the steps of:

provide a substrate having a first and a second major surfaces;

forming a semiconductor stacked structure over the first major surface of the substrate, wherein the semiconductor stacked structure has an n-type gallium nitride-based III-V group compound semiconductor layer, an active layer, and a p-type gallium nitride-based III-V group compound semiconductor layer;

etching the semiconductor stacked structure to expose a part of the n-type semiconductor layer;

forming a first electrode on the n-type semiconductor layer, wherein the first electrode has an ohmic contact layer, a barrier layer over the ohmic contact layer, and a pad layer over the barrier layer, wherein the barrier layer comprises platinum;

performing an annealing process, for lowering contact resistance between the first electrode and the n-type semiconductor layer and activating the p-type semiconductor layer at the same time; and forming a second electrode on the p-type semiconductor layer.

2. The method as in claim 1, further comprising the step of:

implanting silicon atoms into the n-type semiconductor layer before said step of forming a first electrode on the n-type semiconductor layer.

3. The method as in claim 2, further comprising the step of:

performing a recovery for the n-type semiconductor layer after said step of implanting silicon atoms into the n-type semiconductor layer.

4. The method as in claim 1, wherein the first electrode is composed of titanium/aluminum/platinum/gold.

5. The method as in claim 1, wherein the annealing process is performed at a temperature ranging from 400 to 950° C.

* * * * *